United States Patent [19]

Mateika et al.

[11] Patent Number: 5,160,401
[45] Date of Patent: Nov. 3, 1992

[54] METHOD OF GROWING MIXED CRYSTALS FROM MELTS OF OXIDIC MULTICOMPONENT SYSTEMS

[75] Inventors: Dieter Mateika, Ellerbek; Erich Völkel, Lüdinghausen, both of Fed. Rep. of Germany

[73] Assignee: U.S. Philips Corporation, New York, N.Y.

[21] Appl. No.: 650,397

[22] Filed: Feb. 1, 1991

[30] Foreign Application Priority Data

Feb. 3, 1990 [DE] Fed. Rep. of Germany ....... 4003184

[51] Int. Cl.⁵ ............................................. C30B 15/00
[52] U.S. Cl. .................................. 156/600; 156/617.1; 156/626.2; 156/DIG. 87; 156/DIG. 104
[58] Field of Search .................. 156/600, 617.1, 620.2, 156/DIG. 87, DIG. 104

[56] References Cited

U.S. PATENT DOCUMENTS 4,724,038 2/1988 Pastor et al. ............... 156/DIG. 87
4,944,833 7/1990 Belt et al. ................... 156/617.1

FOREIGN PATENT DOCUMENTS 327147 8/1989 European Pat. Off. ......... 156/617.1
140678 3/1980 German Democratic Rep. ................... 156/617.1
48-66598 9/1973 Japan ..................... 156/617.1

OTHER PUBLICATIONS

Brandle et al., "Preparation of Perovskite Oxides for High-Tc-Superconductor Substrates", J. Material Research 5(10), 1990 abstract only pp. 2160–2164.
Greedan et al. "A Systematic Study of Magnetic Order in Divalent Europium Perovskite", J. Solid State Chem, 19(2) 1976 pp. 155–160 (abstract only).

Primary Examiner—Robert Kunemund
Attorney, Agent, or Firm—Norman N. Spain

[57] ABSTRACT

A method of growing mixed crystals having two lattice sites, each of which having a different number of adjoining oxygen ions, from melts of oxidic multicomponent systems, homogeneous mixed crystals being grown in such a manner that the cations which are to populate the first lattice site having the largest number of adjoining oxygen ions and the cations which are to populate the second lattice site having the second largest number of adjoining oxygen ions are selected in such a manner that the ratio between the average ion radii of the cations on the first lattice site and the average ion radii of the cations on the second lattice site ranges from 2.2 to 2.5.

20 Claims, 1 Drawing Sheet

METHOD OF GROWING MIXED CRYSTALS FROM MELTS OF OXIDIC MULTICOMPONENT SYSTEMS

BACKGROUND OF THE INVENTION

The invention relates to a method of growing mixed crystals having two lattice sites, each of which has a different number of adjoining oxygen ions from melts of oxidic multicomponent systems, and to the use of the mixed crystals manufactured in accordance with said method.

To obtain homogeneous crystals, the requirement has to be met that the distribution coefficient of the cations $k_{eff(cat)}$, i.e. the ratio of the concentration of cations in the solid phase to the concentration of cations in the liquid phase $C_s/C_l$ is approximately 1. In this respect, it has to be taken into account that owing to the occurrence of analytical errors in the determination of the chemical composition of small concentrations of cations, distribution coefficients ranging from 0.90 to 1.20 are also included in the range of "approximately 1". Crystals are to be understood to mean herein both monocrystalline and polycrystalline materials.

Discs of single crystals drawn from melts of oxidic multicomponent systems are used, for example, as epitaxy substrates. In order to be able to grow flawless monocrystalline layers on monocrystalline substrates, it is required that the lattice constants of the substrate and the epitaxial layer correspond to each other as much as possible. For example, for the manufacture of monocrystalline superconducting films of, for example, $YBa_2Cu_3O_{7-\delta}$ having lattice constants $a=0.3818$ nm, $b=0.3886$ nm and $c=1.1680$ mn, monocrystalline substrates of, for example, $SrTiO_3$ ($a=0.3909$ nm), $LaAlO_3$ ($a=0.3792$ nm) or $LaGaO_3$ ($a=0.3877$ nm, $b=0.3903$ nm and $c=0.5481$ nm) are used. It is obvious that the lattice constants of all three substrates deviate clearly from the lattice constants of the superconducting film. Besides, microtwins are formed in the $LaGaO_3$ and $LaAlO_3$ crystals in the cooling phase, which microtwins have a strong negative effect on the crystal quality of the substrates. Consequently, such substrates are unsuitable for the manufacture of monocrystalline films of the superconductor. Thus, the simplest possible manner of manufacturing single crystals having the desired lattice constants has to be found.

A possible solution enabling the manufacture of substrates having the desired lattice constants consists in growing homogeneous mixed crystals whose lattice constant is adjusted through the crystal composition. It should be taken into account, however, that the distribution coefficients are of the cations $k_{eff(cat)}$ are in the range of 1, since only then homogeneous mixed crystals, i.e. mixed crystals having an approximately equal lattice constant throughout the length of the crystal drawn, obtained. Mixed crystals can be manufactured by mixing two terminal members of a series of mixed crystals; however, such mixed crystals have distribution coefficients which deviate relatively much from 1. Owing to the resulting low crystal quality and the change of the lattice constant in the longitudinal direction of the crystal, mixed crystals manufactured by mixing two terminal members are generally unsuitable for technical applications.

A possible solution could be the use of multicomponent systems whose melt compositions are used for growing homogeneous mixed crystals, because by virtue of the larger number of cations of said multicomponent systems they offer more possibilities of optimizing the distribution coefficients through the composition. So far, however, systematic approaches in this field are still in the stage of initial proposals.

In order to systematically produce mixed-crystal melt systems in which the distribution coefficients of all cations are close to 1, it is proposed in German Patent Application P 39 048 68.3 to use the average cation to oxygen bond lengths, i.e. structural data, to define such multicomponent systems because the insight has been gained that there is a direct relationship between these structural data and the crystal composition. The average cation to oxygen bond lengths can be calculated for mixed crystals having garnet, perovskite or spinel lattices by means of formulae which have been empirically determined for these lattices and which are known from scientific literature.

SUMMARY OF THE INVENTION

It is an object of the invention to provide a method by means of which compositions of oxidic multicomponent systems for the manufacture of mixed crystals having two lattice sites, each of which lattice sites having a different number of adjoining oxygen atoms, can be found in a systematic manner, which compositions are suitable for the manufacture of melts for growing mixed crystals having distribution coefficients of approximately 1, when formulae for calculating the cation to oxygen average bond length are not available.

According to the invention, this object is achieved in that homogeneous mixed crystals are grown in such a manner that the cations which are to populate the first lattice site having the largest number of adjoining oxygen ions, and the cations which are to populate the second lattice site having the second largest number of adjoining oxygen ions are selected in such a manner that the ratio between the average ion radii of the cations on the first lattice site and the average ion radii of the cations on the second lattice site is in the range from 2.2 to 2.5.

According to the invention it has also been found, that the structural data defined by a specific ratio of the ion radii of the cations ar adjoining lattice sites can be used to systematically determine compositions for melts of oxidic multicomponent systems from which mixed crystals having distribution coefficients of approximately 1 can be grown.

DETAILED DESCRIPTION OF THE DRAWING

Figure 1:
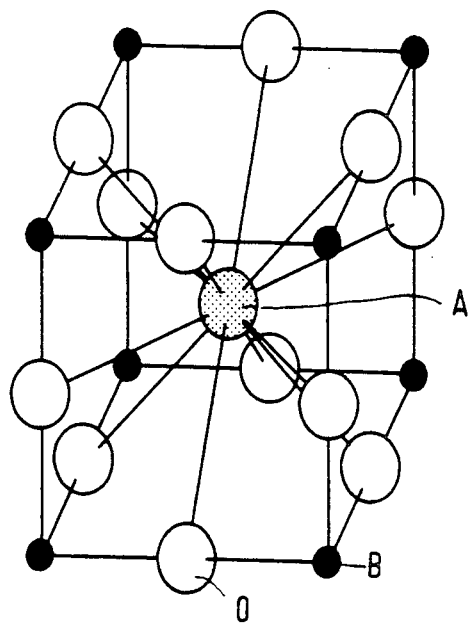
FIG. 1 shows a structural model of cubic perovskites.

In accordance with an advantageous embodiment of the method according to the invention, the cations which are to populate the first lattice site and the cations which are to populate the second lattice site are selected in such a manner that the ratio of the average ion radii of the cations on the first lattice site to the average ion radii of the cations on the second lattice site ranges from 2.23 to 2.46.

In accordance with a further advantageous embodiment of the method according to the invention, the composition of the components forming the melt which are used to grow homogeneous mixed crystals is selected as a function of the average ion radii of the cations of the cubooctahedron site (coordination number = 12) and octahedron site (coordination number = 6) in such a manner that the average ion radii of the cations of the cubo octahedron site are in the range from 0.14167 nm to 0.12842 nm and the average ion radii of the cations of the octahedron site are in the range from 0.05648 nm to 0.05865 nm.

In accordance with yet another advantageous embodiment of the method according to the invention, mixed crystals are grown having a composition as defined by the general formula $RE_wA_xAl_yB_zO_3$ where
RE = 1 cation from the group $La^{3+}$, $Pr^{3+}$, $Ce^{3+}$, $Nd^{3+}$, $Sm^{3+}$,
$Eu^{3+}$, $Gd^{3+}$, $Tb^{3+}$, $Dy^{3+}$, $Ho^{3+}$, $Y^{3+}$,
A = $Ca^{2+}$ and/or $Sr^{2+}$
B = $Ta^{5+}$ and/or $Nb^{5+}$ and
$0.030 \leq w \leq 0.490$
$0.510 \leq x \leq 0.960$
$0.530 \leq y \leq 0.745$
$0.255 \leq z \leq 0.480$.

The mixed crystals manufactured in accordance with the invention method can be advantageously used when crystals having two different lattice sites with specific desired properties are to be manufactured. The mixed crystals manufactured in accordance with the method of the invention are suitable for, for example, the manufacture of monocrystalline layers on substrates, with the lattice constant of the layer to be deposited being adaptable to the lattice constant of the substrate within relatively wide limits by adapting its composition. Such monocrystalline layers are, for example, epitaxial layers which can be manufactured in accordance with known methods, such as, liquid-phase epitaxy or gas-phase epitaxy or by means of a cathode-sputtering process followed by annealing. Monomolecular epitaxial layers can be manufactured by "atomic layer epitaxy". The mixed crystals manufactured in accordance with the inventive method can also advantageously be used for the manufacture of multilayer structures which are provided on a substrate and which are composed of different monocrystalline layers having individual thicknesses of $>100 \times a$ or $<100 \times a$, a being the lattice constant of the material of the relevant layer.

By using multilayer structures of different monocrystalline layers having individual thicknesses $< 100 \times a$, for example, super structures can be formed; super structures are multilayer structures comprising individual layers having different properties.

Using multilayer structures of different monocrystalline layers having individual thicknesses $< 100 \times a$, for example, superlattices can also formed. Superlattices are multilayer structures comprising individual layers of very small thickness (but larger than monomolecular) in which the intrinsic properties of the "bulk material" having a corresponding composition, i.e. the intrinsic properties of a single crystal having larger dimensions ($>100 \times a$), have not yet been formed.

It is alternatively possible, however, to use the mixed crystals manufactured by means of the present method to produce monocrystalline substrates for the deposition of monocrystalline layers, the lattice constants of the substrates being relatively accurately adapted to the lattice constants of the layers to be deposited. This is of particular importance for the further development of components comprising superconducting films which are still in the initial stages of their technological application.

The invention will be described in greater detail by means of exemplary embodiments and with reference to the accompanying drawings.

The systematic manufacture of homogeneous mixed crystals having two lattice sites, each having a different number of adjoining oxygen atoms, with a distribution coefficient of approximately 1, from melts of the oxidic multicomponent systems is explained by means of following example in which rare earth metal/aluminum perovskites are used as host lattices.

FIG. 1 shows the structural model of cubic perovskites. Perovskites are defined by the general formula $ABO_3$. The A-cation in the center of the cell is surrounded by 12 oxygen ions in a cubooctahedral manner. The B-cations in the corners of the cell are octahedrally surrounded by 6 oxygen ions. In the host lattice, the A-sites are populated by rare earth metal and the B-sites are populated by $Al^{3+}$ cations. As regards the mixed crystals, the rare earth metal are partly substituted by $Ca^{2+}$ and/or $Sr^{2+}$ cations and the $Al^{3+}$ cations are partly substituted by $Ta^{5+}$ and/or $Nb^{5+}$ cations. In the structural detail of FIG. 1 only three oxygen ions of each of the B-cations are shown.

Figure 2:
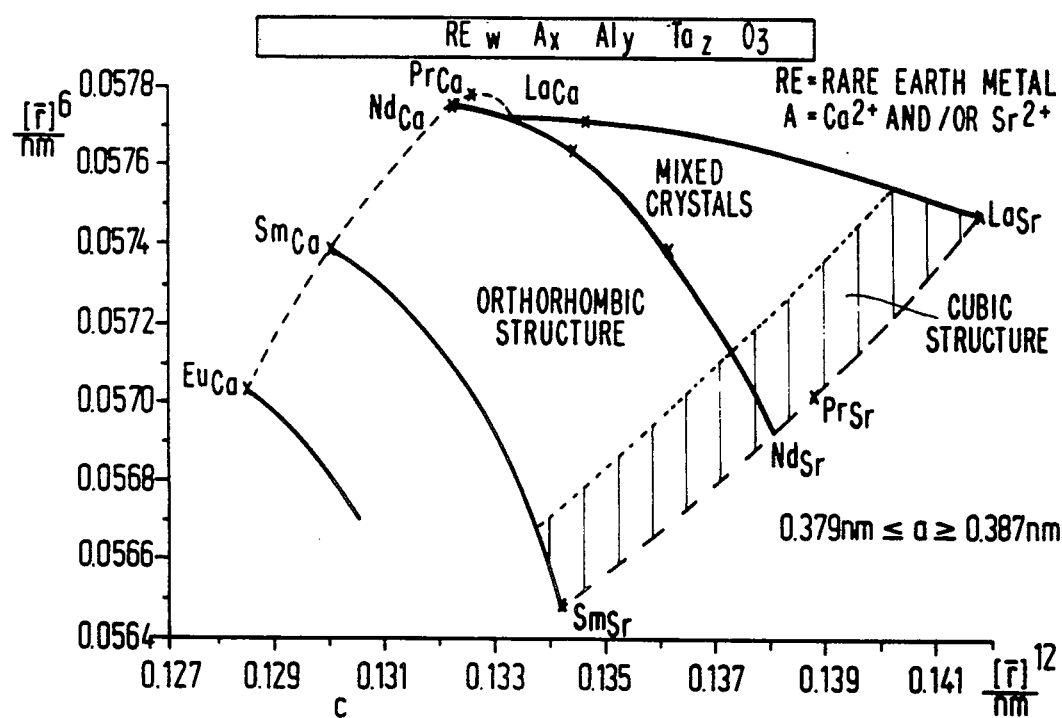
FIG. 2 shows the relation between the average ion radii of the cations on the cubo octahedron site and the average ion radii of the cations on the octahedron site for mixed crystals whose composition is given by the general formula $RE_wA_xAl_yTa_zO_3$.

FIG. 2 shows the relation between the average ion radii of the cations on the cubooctahedron site and the average ion radii of the cations on the octahedron site for mixed crystals having a composition in accordance with the general formula $RE_wA_xAl_yTa_zO_3$, where RE = $Eu^{3+}$, $Sm^{3+}$, $Nd^{3+}$, $Pr^{3+}$, $La^{3+}$, where A = $Ca^{2+}$ and/or $Sr^{2+}$ and $0.219 \leq W \leq 0.490$; $0.510 \leq x \leq 0.772$, $0.615 \leq y \leq 0.745$; $0.255 \leq z \leq 0.391$. The lattice constants in the crystallographic a-direction can be adjusted in the range from 0.379 to 0.387 nm through the crystal composition.

The crystal composition of the perovskites is defined by the general formula $ABO_3$. The A-sites are eventually populated by the following cations: $Na^{1+}$, $K^{1+}$, $Ca^{2+}$, $Sr^{2+}$, $Ba^{2+}$, $Pb^{2+}$, $Y^{3+}$, $Ce^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $La^{3+}$, $Th^{4+}$, $Ce^{4+}$. The B-sites is essentially populated by the following cations: $Li^{1+}$, $Mg^{2+}$, $Zn^{2+}$, $Cu^{2+}$, $Co^{2+}$, $Fe^{2+}$, $Mn^{2+}$, $Ni^{2+}$, $Al^{3+}$, $Ga^{3+}$, $Sc^{3+}$, $In^{3+}$, $Yb^{3+}$, $Lu^{3+}$, $Mn^{3+}$, $Fe^{3+}$, $Co^{3+}$, $Cr^{3+}$, $Ni^{3+}$, $Cu^{3+}$, $Ge^{4+}$, $Hf^{4+}$, $Ce^{4+}$, $Sn^{4+}$, $Cr^{4+}$, $Ti^{4+}$, $Mn^{4+}$, $Ta^{5+}$, $Nb^{5+}$, $V^{5+}$, $Mo^{6+}$, $W^{5+}$, $Mo^{6+}$, $W^{6+}$.

Table 1 lists several ion radii of these cations as a function of the oxygen-coordination number. In perovskites of a simple composition, the A-sites are populated by a large cation and the B-sites are populated by a small cation as, for example, in the compound $LaAlO_3$, where $La^{3+}$-ions populate the A-sites and $Al^{3+}$ ions populate the B-sites. In the following tables such perovskites having a simple composition are used as host lattices. The cations of the host lattices (rare earth metal/aluminum) are partly replaced by the cations $Sr^{2+}$, $Ca^{3+}$, $Ta^{5+}$ or $Nb^{5+}$. For the mixed crystals only those compositions are selected in which the ratio between the average ion radii of the cations on the first lattice site and the average ion radii of the cations on the second lattice site is in the range from 2.2 to 2.5.

Oxide mixtures having such compositions are melted in an iridium crucible under a weakly oxidizing atmosphere. Subsequently, an iridium rod is immersed in the melt and the temperature of the melt is lowered until a crystallizate has formed around said iridium rod. The resultant crystallizate is pulled up from the surface of the melt at a rate of 5 mm/h. The growth process is interrupted when half the starting melt has crystallized. After cooling to room temperature, the composition of the crystallizate is analysed. When the concentration of the substituents (in this case $Sr^{2+}$ and $Ta^{5+}$) in the crystallizate is less than in the starting melt, the distribution coefficients $k_{eff} = C_{cat}$ crystal/$C_{cat}$ melt of $Sr^{2+}$ and $Ta^{5+}$ are <1.

In this case, the process is repeated with a higher concentration of the substituents. As the distribution coefficients increase as the concentration of the substitutents increases, higher values of the distribution coefficients will be obtained in the second process step. The series of experiments carried out with increasing concentration of the substituents is continued until the concentration of the substitutents in the crystallizate is equal to the concentration of the substitutents in the melt ($k_{eff(cat)} \approx 1$). Single crystals are grown from the compositions with $k_{eff(cat)} \approx 1$.

For the manufacture of single crystals, the oxides are mixed in accordance with the results of the experiments, pressed into a cylindrical shape and sintered at a temperature of 1500° C. in an oxygen atmosphere.

For example, for a single crystal of the composition $La_{0.29}Sr_{0.71}Al_{0.645}Ta_{0.355}O_3$, 30.5281 g of $La_2O_3$; 47.5396 g of SrO; 21.2481 g of $Al_2O_3$ and 50.6841 g of $Ta_2O_5$ (overall weight 150.00 g) are mixed and treated further as described above. The sintered body is subsequently melted in an iridium crucible having a diameter of 40 mm and a height of 40 mm at a temperature of approximately 2000° C. in a closed crystal drawing apparatus. An inert gas such as nitrogen or a gas mixture consisting of 90% of $N_2$ plus 10% of $CO_2$ is led through the apparatus. A cylindrical single crystal rod having the same composition (grown from the experiments) and having the crystallographic [100]-orientation parallel to the axis of the rod is used as a seed crystal. The seed crystal is first immersed in the melt (preseeding) after which it is pulled up from the surface of the melt at a rate of 5 mm/h. The growing crystal is rotated about its axis at an accelerating and retarding rate (for example 25 $min^{-1} \rightarrow 75$ $min^{-1}$ of two seconds and 75 $min^{-1} \rightarrow 25$ $min^{-1}$ in one second). The growth process is regulated through a weight control, in such a manner that at first the crystal grows conically widthwise until the desired crystal diameter is attained. Subsequently, the power of the generator is adjusted such that crystal growth continues, while the diameter remains constant. The growth process is ended by rapidly removing the grown crystal from the residual melt. Subsequently, the crystal is slowly cooled to room temperature.

To determine the composition of the crystal and the lattice constants, disc shaped parts are cut from the beginning and the end of the crystal, X-ray fluorescence analysis (analytical errors: ±0.01 formula units) being used to determine the composition of the crystal.

The manufacture of mixed crystals from two mixed-crystal groups having several mixed-crystal series is described below.

1. tantalum group

Mixed crystals are manufactured having a composition as defined by the general formula $RE_wA_xAl_yTa_zO_3$, where $RE = Eu^{3+}$, $Sm^{3+}$, $Nd^{3+}$, $Pr^{3+}$, $La^{3+}$, where $A = Ca^{2+}$ and/or $Sr^{2+}$ and $0.219 \leq w \leq 0.490$; $0.510 \leq x \leq 0.772$; $0.615 \leq y \leq 0.745$; $0.255 \leq z \leq 0.391$.

The average ion radii of the cations of the cubooctahedron and octahedron sites serve as the parameters for the definition of the 5 mixed-crystal series of the tantalum group mentioned below.

The average ion radii of the cations of crystal compositions having a distribution coefficient $k_{eff(cat)} \approx 1$ are diagrammatically shown in the curves of FIG. 2. The average ion radii of the crystal compositions comprising $Ca^{2+}$ and of the crystal compositions comprising $Sr^{2+}$ form the first and last members, respectively, of the mixed-crystal series as shown in the curves consisting of dotted lines in (FIG. 2). The Ca-content of the first members can be gradually substituted by $Sr^{2+}$ cations until the composition of the last member which only comprises $Sr^{2+}$ is obtained. The change of the average ion radii in the mixed-crystal compositions having $Ca^{2+}$ and $Sr^{2+}$ as host ions are shown in the curves consisting of unbroken lines (FIG. 20. The crystal compositions comprising $Sr^{2+}$ as well as the compositions comprising $Sr^{2+}$ and a small proportion of $Ca^{2+}$ have a cubic crystal structure. All the other compositions have an orthorhombic·crystal structure. Each curve shown in FIG. 2 belongs to a specific mixed-crystal series of the tantalum group.

For all mixed-crystal compositions having average ion radii in accordance with the curves shown in FIG. 2, the distribution coefficients are approximately 1.

The compositions of the mixed-crystal series are defined as follows:

1. $La_wCa_xSr_vAl_yTa_zO_3$ (in accordance with La-curve in FIG. 2).

The first member of the mixed-crystal series is defined by the formula $La_{0.221}Ca_{0.763}Al_{0.622}Ta_{0.389}O_3$, where the average ion radii of the cations for the cubo octahedron site and octahedron site are:

$[r]^{12} = 0.13311$ nm, $[r]^6 = 0.05772$ nm.

The last member of the mixed-crystal series is defined by the formula $La_{0.290}Sr_{0.710}Al_{0.645}Ta_{0.355}O_3$, where the average ion radii of the cations for the cubooctahedron site and octahedron site are:

$[r]^{12} = 0.14168$ nm, $[r]^6 = 0.05749$ nm.

The mixed-crystal compositions are in the following range:

$0.221 \leq La \leq 0.290$; $0 \leq Ca \leq 0.763$; $0 \leq Sr \leq 0.710$; $0.622 \leq Al \leq 0.645$; $0.355 \leq Ta \leq 0.389$.

The composition of the melt is indicated each time in Table 2. This also applies to all the following exemplary embodiments.

2. $Pr_wCa_xSr_vAl_yTa_zO_3$.

The first member of the mixed-crystal series is defined by the formula $Pr_{0.219}Ca_{0.772}Al_{0.615}Ta_{0.391}O_3$, where the average ion radii of the cations for the cubooctahedron site and the octahedron site are:

$[r]^{12} = 1.3236$ nm; $[r]^6 = 0.05778$ nm.

The last member of the mixed -crystal series is defined by the formula $Pr_{0.38}Sr_{0.62}Al_{0.69}Ta_{0.31}O_3$, where the average ion radii for the cations on the cubooctahedron site and the octahedron site are:

$[r]^{12} = 0.13868$ nm, $[r]^6 = 0.05703$ nm.

The mixed-crystal compositions are in the following range:
$0.219 \leq Pr \leq 0.38$; $0 \leq Ca \leq 0.772$; $0 \leq Sr \leq 0.62$; $0.615 \leq Al \leq 0.69$; $0.31 \leq Ta \leq 0.391$.

3. $Nd_wCa_xSr_vAl_yTa_zO_3$
(Nd curve in FIG. 2).

The first member of the mixed-crystal series is defined by the formula $Nd_{0.225}Ca_{0.766}Al_{0.619}Ta_{0.387}O_3$, where the average ion radii for the cations on the cubooctahedron site and the octahedron site are:
$[r]^{12} = 0.13211$ nm. $[r]^6 = 0.05775$ nm.

The last member of the mixed-crystal series is defined by the formula: $Nd_{0.40}Sr_{0.60}Al_{0.70}Ta_{0.30}O_3$, where the average ion radii for the cations on the cubooctahedron site and the octahedron site are:
$[r]^{12} = 0.138$ nm, $[r]^6 = 0.05693$ nm.

The mixed-crystal compositions are in the following range:
$0.255 \leq Nd \leq 0.40$; $0 \leq Ca \leq 0.766$; $0 \leq Sr \leq 0.60$; $0.619 \leq Al \leq 0.700$; $0.300 \leq Ta \leq 0.387$.

4. $Sm_wCa_xSr_vAl_yTa_zO_3$
(Sm-curve in FIG. 2).

The first member of the mixed-crystal series is defined by the formula $Sm_{0.288}Ca_{0.697}Al_{0.654}Ta_{0.356}O_3$, where the average ion radii or the cations on the cubooctahedron site and the octahedron site are:
$[r]^{12} = 0.12985$ nm, $[r]^6 = 0.05739$ nm.

The last member of the mixed-crystal series is defined by the formula: $Sm_{0.49}Sr_{0.51}Al_{0.745}Ta_{0.255}O_3$, where the average ion radii for the cations on the cubooctahedron site and the octahedron site are:
$[r]^{12} = 0.1342$ nm, $[r]^6 = 0.05648$ nm.

The mixed-crystal compositions range as follows:
$0.288 \leq Sm \leq 0.49$; $0 \leq Ca \leq 0.697$; $0 \leq Sr \leq 0.51$; $0.654 \leq Al \leq 0.745$; $0.255 \leq Ta \leq 0.356$.

5. $Eu_wCa_xSr_vAl_yTa_zO_3$
(Eu - curve in FIG. 2).

The first member of the mixed-crystal series is defined by the formula: $Eu_{0.356}Ca_{0.626}Al_{0.69}Ta_{0.322}O_3$, where the average ion radii for the cations on the cubooctahedron site and the octahedron site are:
$[r]^{12} = 0.12842$ nm, $[r]^6 = 0.05703$ nm.

The last member of the mixed-crystal series is defined by the formula: $Eu_{0.43}Ca_{0.315}Sr_{0.243}Al_{0.723}Ta_{0.285}O_3$, where the average ion radii for the cations on the cubo octahedron site and octahedron site are:
$[r]^{12} = 0.13051$ nm, $[r]^6 = 0.05670$ nm.

The mixed-crystal compositions range as are in the following range:
$0.356 \leq Eu \leq 0.43$; $0.315 \leq Ca \leq 0.626$; $0 \leq Sr \leq 0.243$; $0.69 \leq Al \leq 0.723$; $0.285 \leq Ta \leq 0.322$.

The limits of the mixed-crystal formation in the tantalum group are reached when the functional values of the curves in accordance with FIG. 2 can no longer be attained due to the formation of foreign phases.

The formation of mixed crystals takes place by the coupled substitution of the rear earth metal and aluminum cations by alkaline earth and tantalum cations in accordance with the following scheme:
$2La^{3+} + Al^{3+} \rightarrow 2Ca^{2+} + Ta^{5+}$.

The analytical results show that in the case of Ca-containing mixed crystals the sum of the cations on the cubo octahedron site (for example $La^{3+} + Ca^{2+}$) is $<1$, whereas the sum of the cations on the octahedron site (for example $Al^{3+} + Ta^{5+}$) is $>1$. For the interpretation of this result, it is assumed that small concentrations of tantalum also populate the cubooctahedron site. At the same time, cation vacancies are formed on the A-site in accordance with the scheme $RE^{3+} + Ca^{2+} \rightarrow Ta^{5+} +$ vacancy. The Ta concentration varies in the range from 0.02 to $<0.005$ formula units. This concentration increases according as the radii of the rare earth metals decrease. As regards tantalum on the A-site (in accordance with Shanon loc. cit.) a radius of 0.074 nm is assumed.

In the tantalum group, the lattice constants in the crystallographic a-direction can be adjusted between 0.379 nm and 0.387 nm by means of the crystal composition, using the unit cell as a standard cf. FIG. 2 and Table 2.

By means of the Czochralski method, single crystals were manufactured from melts of the above-described mixed-crystal systems. The values of the melt and crystal compositions, the average ion radii, the distribution coefficients $k_{eff(cat)}$, the lattice constants, the bond lengths for cubic perovskites as well as the lattice constants, with the unit cell as a standard, are listed in Table 2. The crystals grown have a diameter of 15 mm and crystal lengths of 50 mm.

2. Niobium group.

Mixed crystals were grown having a composition in accordance with the general formula:
$RE_wA_xAl_yNb_zO_3$,
where $RE = Y^{3+}$, $Ho^{3+}$, $Dy^{3+}$, $Tb^{3+}$, $Gd^{3+}$, $Sm^{3+}$, $Nd^{3+}$, $Pr^{3+}$, $La^{3+}$, where $A = Ca^{2+}$ and/or $Sr^{2+}$ and $0.030 \leq w \leq 0.320$; $0.0680 \leq x \leq 0.960$; $0.630 \leq y \leq 0.660$; $0.340 \leq z \leq 4.480$.

Figure 3:
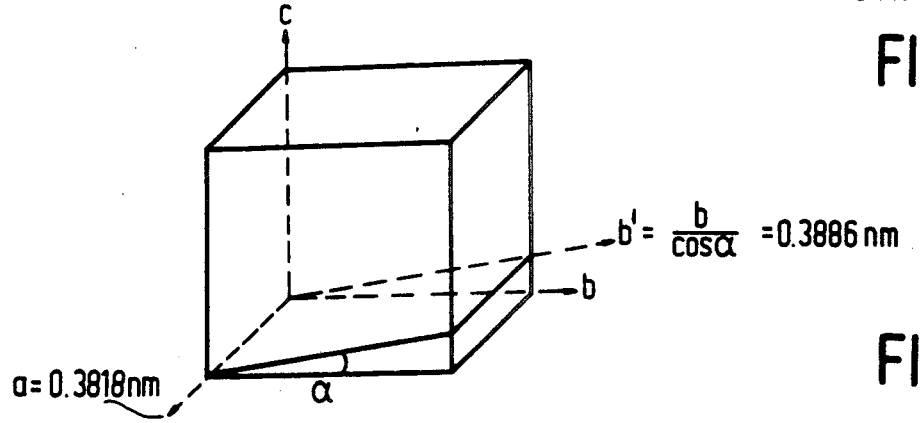
FIG. 3 is a diagrammatic representation for the adaptation of the second lattice constant $b'$ as a function of the angle between the crystallographic b-axis and an assumed $b'$-axis for the use of the mixed crystals as substrates for high-temperature superconducting films.

As shown in Table 1, the radius of the pentavalent cation of niobium is equal to that of the pentavalent cation of tantalum, i.e. 0.064 nm. Consequently, it can be used in the mixed crystals instead of $Ta^{5+}$. As in the tantalum group, several mixed-crystal series having distribution coefficients $k_{eff(cat)} \approx 1$ are also obtained in the niobium group. However, these mixed-crystal series use rare earth metals having smaller radii. As an example of the mixed-crystal formation in the niobium group, Table 3 lists the values of six melt and crystal compositions, the average ion radii, the distribution coefficients $k_{eff(cat)}$, the bond lengths for cubic perovskites, the lattice constants as well as the lattice constants having the unit cell as a standard. Mixed crystals manufactured in accordance with the present method can be used as substrates for the epitaxy of high-temperature superconducting films, the lattice constants of the substrates being adapted to the lattice constants of the film to be applied. A high-temperature superconductor, such as the compound $YBa_2Cu_3O_{7-\delta}$ has the following values of the lattice constants $a = 0.3818$ nm, $b = 0.3886$ nm and $c = 1.1680$ nm. To ensure the monocrystalline growth of such a film on a substrate, it is required for the a and b lattice constants in the plane of growth of the substrate and the film to be very close to each other. The perovskite-mixed crystals manufactured in accordance with the method have a a-lattice constant (smallest lattice constant) in the range from 0.379 nm to 0.387 nm. To adapt the substrate lattice constants to the lattice constants of the film, for example of the superconductor $YBa_2Cu_3O_{7-\delta}$ where $a = 0.3818$ nm and $b = 0.3886$ nm, first a mixed crystal is grown whose a-lattice constant (smallest lattice constant) is adjusted to a value of $a = 0.3818$ nm through the crystal composition. Subsequently, the mixed crystal is oriented and tilted about the c-axis so that an angle of up to 10° is formed between the b-axis and b'-axis (see FIG. 3). In this manner, the second larger lattice constant is adjusted which is obtained from the equation $$b' = \frac{b}{\cos\alpha}$$

The mixed crystal is subsequently cut into discs having a thickness of 0.5 mm which are then polished. The substrate discs thus obtained have the following lattice constants in the plane of growth: a=0.3818 nm and b'=0.3886 nm (see FIG. 3).

TABLE 1

RADII OF THE CATIONS

| Cubo octahedron site | | | Octahedron site | | |
|---|---|---|---|---|---|
| Cation | Radius in nm | | Cation | Radius in nm | |
| $Ba^{2+}$ | 0.161 | (a) | $Al^{3+}$ | 0.0539 | (b) |
| $Ca^{2+}$ | 0.134 | (a) | $Ga^{3+}$ | 0.0610 | (b) |
| $Ce^{3+}$ | 0.134 | (a) | $Hf^{4+}$ | 0.071 | (a) |
| $Dy^{3+}$ | 0.1175 | (c) | $In^{3+}$ | 0.0792 | (b) |
| $Eu^{3+}$ | 0.1226 | (c) | $Mg^{2+}$ | 0.0720 | (a) |
| $Gd^{3+}$ | 0.121 | (c) | $Nb^{5+}$ | 0.064 | (a) |
| $K^{1+}$ | 0.164 | (a) | $Ta^{5+}$ | 0.064 | (a) |
| $La^{3+}$ | 0.136 | (a) | $Ti^{4+}$ | 0.0582 | (b) |
| $Na^{1+}$ | 0.139 | (a) | $Zr^{4+}$ | 0.0745 | (b) |
| $Nd^{3+}$ | 0.129 | (c) | | | |
| $Pr^{3+}$ | 0.130 | (a) | | | |
| $Sm^{3+}$ | 0.124 | (a) | | | |
| $Sr^{2+}$ | 0.144 | (a) | | | |
| $Tb^{3+}$ | 0.119 | (c) | | | |
| $Y^{3+}$ | 0.1158 | (c) | | | |

(a) Ion radii in accordance with Shanon, Acta Cryst. (1976), A32, p. 751.
(b) Ion radii in accordance with Strocka et al., Philips J. Res. 33 (1978), pp. 186-202
(c) Ion radii calculated

TABLE 2

| Nr. | | melt-(I), Crystal composition (II) bond lengths (A-O) (B-O) in nm (III) and keff (VI) | | | | $[F]^{12}$ nm | $[F]^6$ nm | $a_{ober.}$ nm | a nm | b nm | c nm | a/2 nm | a/$\sqrt{2}$ nm |
|---|---|---|---|---|---|---|---|---|---|---|---|---|---|
| | | Lanthanum-Perovskite | | | | | | | | | | | |
| 1 | (I) | $La_{0.290}$ | $Sr_{0.710}$ | | $Al_{0.615}$ $Ta_{0.355}$ $O_3$ | 0.14168 | 0.05749 | 0.7740 | | | | | |
| | (II) | $La_{0.285}$ | $Sr_{0.715}$ | | $Al_{0.643}$ $Ta_{0.357}$ $O_3$ | | | | 0.7741 | | | 0.3871 | |
| | (III) | (0.2737) | | | (0.1935) | | | | | | | | |
| | (IV) | 0.98 | 1.01 | | 1.00 1.01 | | | | | | | | |
| 2 | (I) | $La_{0.230}$ | $Sr_{0.100}$ | $Ca_{0.658}$ | $Al_{0.623}$ $Ta_{0.385}$ $O_3$ | 0.13444 | 0.05771 | | | | | | |
| | (II) | $La_{0.240}$ | $Sr_{0.101}$ | $Ca_{0.650}$ | $Al_{0.621}$ $Ta_{0.383}$ $O_3$ | | | | 0.5412 | 0.5417 | 0.7657 | | 0.3827 |
| | (IV) | 1.04 | 1.01 | 0.99 | 1.00 0.99 | | | | | | | | |
| 3 | (I) | $La_{0.221}$ | | $Ca_{0.763}$ | $Al_{0.622}$ $Ta_{0.389}$ $O_3$ | 0.13311 | 0.5772 | | | | | | |
| | (II) | $La_{0.226}$ | | $Ca_{0.769}$ | $Al_{0.619}$ $Ta_{0.386}$ $O_3$ | | | | 0.5395 | 0.5400 | 0.7640 | | 0.3815 |
| | (IV) | 1.02 | | 1.01 | 1.00 0.99 | | | | | | | | |
| | | Praseodymium-Preovskite | | | | | | | | | | | |
| 4 | (I) | $Pr_{0.380}$ | $Sr_{0.620}$ | | $Al_{0.690}$ $Ta_{0.310}$ $O_3$ | 0.13868 | 0.05703 | 0.7696 | | | | | |
| | (II) | $Pr_{0.382}$ | $Sr_{0.618}$ | | $Al_{0.691}$ $Ta_{0.309}$ $O_3$ | | | | 0.7698 | | | 0.3849 | |
| | (III) | (0.2721) | | | (0.1924) | | | | | | | | |
| | (IV) | 1.01 | 1.00 | | 1.00 1.00 | | | | | | | | |
| 5 | (I)* | $Pr_{0.219}$ | | $Ca_{0.772}$ | $Al_{0.615}$ $Ta_{0.391}$ $O_3$ | 0.13236 | 0.05778 | | | | | | |
| | | Neodymium-Perovskite | | | | | | | | | | | |
| 6 | (I) | $Nd_{0.400}$ | $Sr_{0.600}$ | | $Al_{0.700}$ $Ta_{0.300}$ $O_3$ | 0.13800 | 0.05693 | 0.7687 | | | | | |
| | (II) | $Nd_{0.399}$ | $Sr_{0.601}$ | | $Al_{0.700}$ $Ta_{0.300}$ $O_3$ | | | | 0.7689 | | | 0.3845 | |
| | (III) | (0.2718) | | | (0.1922) | | | | | | | | |
| | (IV) | 1.00 | 1.00 | | 1.00 1.00 | | | | | | | | |
| 7 | (I) | $Nd_{0.306}$ | $Sr_{0.374}$ | $Ca_{0.317}$ | $Al_{0.655}$ $Ta_{0.347}$ $O_3$ | 0.13596 | 0.05738 | | | | | | |
| | (II) | $Nd_{0.308}$ | $Sr_{0.372}$ | $Ca_{0.315}$ | $Al_{0.654}$ $Ta_{0.348}$ $O_3$ | | | | 0.5430 | 0.5438 | 0.7683 | | 0.3840 |
| | (IV) | 1.01 | 0.99 | 1.00 | 1.00 | | | | | | | | |
| 8 | (I) | $Nd_{0.254}$ | $Sr_{0.200}$ | $Ca_{0.540}$ | $Al_{0.631}$ $Ta_{0.373}$ $O_3$ | 0.13422 | 0.05763 | | | | | | |
| | (II) | $Nd_{0.261}$ | $Sr_{0.196}$ | $Ca_{0.533}$ | $Al_{0.624}$ $Ta_{0.378}$ $O_3$ | | | | 0.5400 | 0.5408 | 0.7644 | | 0.3818 |
| | (IV) | 1.03 | 0.98 | 0.99 | 0.99 1.01 | | | | | | | | |
| 9 | (I) | $Nd_{0.225}$ | | $Ca_{0.766}$ | $Al_{0.619}$ $Ta_{0.387}$ $O_3$ | 0.13211 | 0.05775 | | | | | | |
| | (II) | $Nd_{0.226}$ | | $Ca_{0.763}$ | $Al_{0.620}$ $Ta_{0.386}$ $O_3$ | | | | 0.5372 | 0.5393 | 0.7607 | | 0.3799 |
| | (IV) | 1.00 | | 1.00 | 1.00 1.00 | | | | | | | | |
| | | Samarium-Perovskite | | | | | | | | | | | |
| 10 | (I) | $Sm_{0.490}$ | $Sr_{0.510}$ | | $Al_{0.745}$ $Ta_{0.255}$ $O_3$ | 0.13420 | 0.05648 | 0.7640 | | | | | |
| | (II) | $Sm_{0.488}$ | $Sr_{0.512}$ | | $Al_{0.745}$ $Ta_{0.255}$ $O_3$ | | | | 0.3820 | | | | |
| | (III) | (0.2701) | | | (0.1910) | | | | | | | | |
| | (IV) | 1.00 | 1.00 | | 1.00 1.00 | | | | | | | | |
| 11 | (I) | $Sm_{0.288}$ | | $Ca_{0.697}$ | $Al_{0.0654}$ $Ta_{0.356}$ $O_3$ | 0.12985 | 0.05739 | | | | | | |
| | (II) | $Sm_{0.290}$ | | $Ca_{.0.700}$ | $Al_{0.657}$ $Ta_{0.352}$ $O_3$ | | | | 0.5365 | 0.5385 | 0.7580 | | 0.3794 |
| | (IV) | 1.01 | | 1.00 | 1.00 0.99 | | | | | | | | |
| | | Europium-Perovskite | | | | | | | | | | | |
| 12 | (I*) | $Eu_{0.430}$ | $Sr_{.0243}$ | $Ca_{0.315}$ | $Al_{0.723}$ $Ta_{0.285}$ $O_3$ | 0.13051 | 0.05670 | | | | | | |
| 13 | (I) | $Eu_{0.356}$ | | $Ca_{0.626}$ | $Al_{0.690}$ $Ta_{0.322}$ $O_3$ | 0.12842 | 0.05703 | | | | | | |
| | (II) | $Eu_{0.349}$ | | $Ca_{0.631}$ | $Al_{0.692}$ $Ta_{0.323}$ $O_3$ | | | | 0.5357 | 0.5369 | 0.7550 | | 0.3788 |
| | (IV) | 0.98 | | 1.01 | 1.00 1.00 | | | | | | | | |

*compositions calculated

TABLE 3

| Nr. | | melt-(I), Crystal composition (II) bond lengths (A-O) (B-O) in nm (III) and keff (VI) | | | | $[F]^{12}$ nm | $[F]^6$ nm | $a_{ober.}$ nm | Lattice constants | | | | |
|---|---|---|---|---|---|---|---|---|---|---|---|---|---|
| | | | | | | | | | a nm | b nm | c nm | a/2 nm | a/$\sqrt{2}$ nm |
| | | Lanthanum-Perovskite | | | | | | | | | | | |
| 14 | (I) | $La_{0.030}$ | | $Ca_{0.960}$ | $Al_{0.530}$ $Nb_{0.480}$ $O_3$ | 0.13346 | 0.05865 | | | | | | |
| | (II) | $La_{0.035}$ | | $Ca_{0.955}$ | $Al_{0.529}$ $Nb_{0.481}$ $O_3$ | | | | 0.5384 | 0.5416 | 0.7628 | | 0.3807 |
| | (IV) | 4.47 | | 0.99 | 1.00 1.00 | | | | | | | | |
| | | Neodymium-Perovskite | | | | | | | | | | | |
| 15 | (I) | $Nd_{0.190}$ | $Sr_{0.810}$ | | $Al_{0.595}$ $Nb_{0.405}$ $O_3$ | 0.14115 | 0.5799 | 0.3873 | | | | | |
| | (II) | $Nd_{0.192}$ | $Sr_{0.808}$ | | $Al_{0.597}$ $Nb_{0.403}$ $O_3$ | | | | | 0.3872 | | | |
| | (III) | 1.01 | 1.00 | | 1.00 1.00 | | | | | | | | |
| | (IV) | (0.2739) | | | (0.1936) | | | | | | | | |
| | | Samarium-Perovskite | | | | | | | | | | | |
| 16 | (I) | $Sm_{0.320}$ | $Sr_{0.680}$ | | $Al_{0.660}$ $Nb_{0.340}$ $O_3$ | 0.13760 | 0.05733 | 0.3845 | | | | | |
| | (II) | $Sm_{0.315}$ | $Sr_{0.685}$ | | $Al_{0.658}$ $Nb_{0.342}$ $O_3$ | | | | | 0.3847 | | | |
| | (III) | (0.2719) | | | (0.1923) | | | | | | | | |
| | (IV) | 0.98 | 1.01 | | 1.00 1.01 | | | | | | | | |
| | | Gadolinium-Perovskite | | | | | | | | | | | |
| 17 | (I) | $Gd_{0.075}$ | | $Ca_{0.910}$ | $Al_{0.560}$ $Nb_{0.455}$ $O_3$ | 0.13213 | 0.05834 | | | | | | |
| | (II) | $Gd_{0.080}$ | | $Ca_{0.900}$ | $Al_{0.565}$ $Nb_{0.455}$ $O_3$ | | | | 0.5365 | 0.5407 | 0.7609 | | 0.3794 |
| | (IV) | 1.07 | | 0.99 | 1.01 1.00 | | | | | | | | |
| 18 | (I) | $Gd_{0.116}$ | $Sr_{0.206}$ | $Ca_{0.670}$ | $Al_{0.570}$ $Nb_{0.438}$ $O_3$ | 0.13407 | 0.05824 | | | | | | |
| | (II) | $Gd_{0.115}$ | $Sr_{0.204}$ | $Ca_{0.670}$ | $Al_{0.573}$ $Nb_{0.438}$ $O_3$ | | | | 0.5382 | 0.5403 | 0.7619 | | 0.3806 |
| | (IV) | 0.99 | 0.99 | 1.00 | 1.01 1.00 | | | | | | | | |
| | | Yttrium-Perovskite | | | | | | | | | | | |
| 19 | (I) | $Y_{0.290}$ | | $Ca_{0.700}$ | $Al_{0.660}$ $Nb_{0.350}$ $O_3$ | 0.12812 | 0.05733 | | | | | | |
| | (II) | $Y_{0.285}$ | | $Ca_{0.705}$ | $Al_{0.658}$ $Nb_{0.352}$ $O_3$ | | | | 0.5358 | 0.5400 | 0.7597 | | 0.3789 |
| | (IV) | 0.98 | | 1.01 | 1.00 1.01 | | | | | | | | |

We claim:

1. A method of growing mixed crystals having at least two lattice sites, each of which sites has a different number of adjoining oxygen atoms characterized in that said homogenous mixed crystals are grown by forming melts in which the cations which are to populate a lattice site having the largest number of adjoining oxygen ions and cations which are to populate a second lattice site having the second largest number of adjoining oxygen atoms are selected in such a manner that the ratio between the average ion radii of the cations on the first lattice site and the average ion radii of the cations on the second lattice site ranges from 2.2 to 2.5 and pulling said crystals on nucleating means from said melts.

2. A method as claimed in claim 1, characterized in that the cations which are to populate the first lattice site and the cations which are to populate the second lattice site are selected in such a manner that the ratio between the average ion radii of the cations on the first lattice site and the average ion radii of the cations on the second lattice site ranges from 2.23 to 2.46.

3. A method of growing mixed crystals on the basis of rare earth metal/aluminum perovskite as claimed in claim 1, characterized in that the composition of the components forming the melt which are used to grow homogeneous mixed crystals is selected as a function of the average ion radii of the cations of a cubooctahedron site (coordination number = 12) and octahedron site (coordination number = 6), in such a manner that the average ion radii of the cations of the cubooctahedron site range from 0.14168 nm to 0.12842 nm and the average ion radii of the cations of the octahedron site range from 0.05865 nm to 0.05648 nm.

4. A method as claimed in claim 1, characterized in that mixed crystals are grown having a composition in accordance with the general formula:
$RE_wA_xAl_yB_zO_3$, where
RE = 1 a cation selected from the group consisting of $La^{3+}$, $Pr^{3+}$, $Ce^{3+}$, $Nd^{3+}$, $Sm^{3+}$, $Eu^{3+}$, $Gd^{3+}$, $Tb^{3+}$, $Dy^{3+}$, $Ho^{3+}$ and $Y^{3+}$;
A = $Ca^{2+}$ and/or $Sr^{2+}$;
B = $Ta^{5+}$ and/or $Nb^{5+}$ and
$0.030 \leq w \leq 0.490$
$0.510 \leq x \leq 0.960$
$0.530 \leq y \leq 0.745$
$0.255 \leq z \leq 0.480$.

5. A method as claimed in claim 4, characterized in that mixed crystals are grown having a composition in accordance with the general formula:
$RE_wA_xAl_yTa_zO_3$, where
RE = 1 cation selected from the group consisting of $Eu^{3+}$, $Sm^{3+}$, $Nd^{3+}$, $Pr^{3+}$, $La^{3+}$; and
A = $Ca^{2+}$ and/or $Sr^{2+}$ and
$0.219 \leq w \leq 0.490$
$0.510 \leq x \leq 0.772$
$0.615 \leq y \leq 0.745$
$0.255 \leq z \leq 0.391$.

6. A method as claimed in claim 5, characterized in that the composition of the mixed crystals comprises a mixed-crystal series having a composition in accordance with the general formula:
$La_wCa_xSr_vAl_yTa_zO_3$, where
$0 \leq v \leq 0.710$
$0.221 \leq w \leq 0.290$
$0 \leq x \leq 0.763$
$0.622 \leq y \leq 0.645$
$0.355 \leq z \leq 0.389$.

7. A method as claimed in claim 6, characterized in that the first member of the mixed-crystal series has the following melt composition:
$La_{0.221}Ca_{0.763}Al_{0.622}Ta_{0.389}O_3$ and in that the last member of the mixed-crystal series has the following melt composition:
$La_{0.290}Sr_{0.710}Al_{0.645}Ta_{0.355}O_3$.

8. A method as claimed in claim 5, characterized in that the composition of the mixed crystals comprises a mixed-crystal series having a composition in accordance with the general formula:
$Pr_wCa_xSr_vAl_yTa_zO_3$, where
$0 \leq v \leq 0.620$ $0.219 \leq w \leq 0.380$
$0 \leq x \leq 0.772$
$0.615 \leq y \leq 0.690$
$0.310 \leq z \leq 0.391$.

9. A method as claimed in claim 8, characterized in that the first member of the mixed-crystal series has the following melt composition:
$Pr_{0.219}Ca_{0.772}Al_{0.615}Ta_{0.391}O_3$,
and in that the last member of the mixed-crystal series has the following melt composition:
$Pr_{0.38}Sr_{0.62}Al_{0.69}Ta_{0.31}O_3$.

10. A method as claimed in claim 5, characterized in that the composition of the mixed crystals comprises a mixed-crystal series having a composition in accordance with the general formula:
$Nd_wCa_xSr_vAl_yTa_zO_3$, where
$0 \leq v \leq 0.600$
$0.225 \leq w \leq 0.400$
$0 \leq x \leq 0.766$
$0.619 \leq y \leq 0.700$
$0.300 \leq z \leq 0.387$.

11. A method as claimed in claim 10, characterized in that the first member of the mixed-crystal series has the following melt composition:
$Nd_{0.225}Ca_{0.766}Al_{0.619}Ta_{0.387}O_3$
and in that the last member of the mixed-crystal series has the following melt composition:
$Nd_{0.40}Sr_{0.60}Al_{0.70}Ta_{0.30}O_3$.

12. A method as claimed in claim 5, characterized in that the composition of the mixed crystals comprises a mixed-crystal series having a composition in accordance with the general formula:
$Sm_wCa_xSr_vAl_yTa_zO_3$, where
$0 \leq v \leq 0.510$
$0.288 \leq w \leq 0.490$
$0 \leq x \leq 0.697$
$0.654 \leq y \leq 0.745$
$0.255 \leq z \leq 0.356$.

13. A method as claimed in claim 12, characterized in that the first member of the mixed-crystal series has the following melt composition:
$Sm_{0.288}Ca_{0.697}Al_{0.654}Ta_{0.356}O_3$
and in that the last member of the mixed-crystal series has the following melt composition:
$Sm_{0.49}Sr_{0.51}Al_{0.745}Ta_{0.255}O_3$.

14. A method as claimed in claim 5, characterized in that the composition of the mixed crystals comprises a mixed-crystal series having a composition in accordance with the general formula:
$Eu_wCa_xSr_vAl_yTa_zO_3$, where
$0 \leq v \leq 0.243$
$0.356 \leq w \leq 0.430$
$0.315 \leq x \leq 0.626$
$0.690 \leq y \leq 0.723$
$0.285 \leq z \leq 0.322$.

15. A method as claimed in claim 14, characterized in that the first member of the mixed-crystal series has the following melt composition:
$Eu_{0.356}Ca_{0.626}Al_{0.69}Ta_{0.322}O_3$
and in that the last member of the mixed-crystal series has the following melt composition:
$Eu_{0.43}Ca_{0.315}Sr_{0.243}Al_{0.723}Ta_{0.285}O_3$.

16. A method as claimed in claim 4, characterized in that mixed crystals are grown having a composition in accordance with the general formula:
$RE_wA_xAl_yNb_zO_3$, where
RE = 1 cation from the group $Y^{3+}$, $Ho^{3+}$, $Dy^{3+}$, $Tb^{3+}$, $Gd^{3+}$, $Sm^{3+}$, $Nd^{3+}$, $Pr^{3+}$, $La^{3+}$;
A = $Ca^{2+}$ and/or $Sr^{2+}$, and
$0.030 \leq w \leq 0.320$
$0.680 \leq x \leq 0.960$
$0.530 \leq y \leq 0.660$
$0.340 \leq z \leq 0.480$.

17. In the manufacture of monocrystalline layers on substrates, the improvement wherein mixed crystals manufactured in accordance with the method of claim 1 are employed.

18. In the manufacture of multilayer structures provided on a substrate which structures are composed of different monocrystalline layers having individual thicknesses of $> 100 \times a$, a being the lattice constant of the material of relevant layer, the improvement wherein mixed crystals manufactured in accordance with the method of claim 1 are employed.

19. In the manufacture of multilayer structures provided on a substrate which structures are composed of different monocrystalline layers having individual thicknesses of $< 100 \times a$, a being the lattice constant of the material of relevant layer, the improvement wherein mixed crystals manufactured in accordance with the method of claim 1 are employed.

20. In the manufacture of monocrystalline substrates having described lattice constants, the improvement wherein mixed crystals manufactured in accordance with the method of claim 1 are employed.

* * * * *